United States Patent [19]

Arai et al.

[11] Patent Number: 5,254,369

[45] Date of Patent: Oct. 19, 1993

[54] METHOD OF FORMING A SILICON DIFFUSION AND/OR OVERLAY COATING ON THE SURFACE OF A METALLIC SUBSTRATE BY CHEMICAL VAPOR DEPOSITION

[75] Inventors: Juichi Arai, Ibaraki; Eiichi Ozawa, Chiba; Jean-Marie Friedt, Funakawara, all of Japan

[73] Assignee: L'Air Liquide, Societe Anonyme pour l'Etude et l'Exploitation des Procedes Georges Claude, Paris Cedex, France

[21] Appl. No.: 878,465

[22] Filed: May 5, 1992

Related U.S. Application Data

[63] Continuation-in-part of Ser. No. 686,487, Apr. 17, 1991, abandoned.

[51] Int. Cl.$^5$ .............................................. C23C 16/00
[52] U.S. Cl. ............................. 427/248.1; 427/255.1; 427/255; 427/314; 427/327
[58] Field of Search ................. 427/248.1, 255.1, 255, 427/314, 327

[56] References Cited

U.S. PATENT DOCUMENTS

| | | | |
|---|---|---|---|
| 4,579,752 | 4/1986 | Dubois et al. | 427/255 |
| 4,787,942 | 11/1988 | Wray | 148/6.15 |
| 4,822,642 | 4/1989 | Cabrera et al. | 427/255.1 |
| 4,869,929 | 9/1989 | Cabrera et al. | 427/249 |
| 4,957,777 | 9/1990 | Ilderem et al. | 427/55 |
| 5,064,691 | 11/1991 | Kirner et al. | 427/252 |

FOREIGN PATENT DOCUMENTS 0226130 6/1987 European Pat. Off. .

OTHER PUBLICATIONS

Journal of the Electrochemical Society, vol. 128, No. 6, Jun. 1, 1981, pp. 1368–1373, M. J. Rice, et al., "Interaction of CVD Silicon with Molybdenum Substrates".

*Primary Examiner*—Roy King
*Attorney, Agent, or Firm*—Oblon, Spivak, McClelland, Maier & Neustadt

[57] ABSTRACT

The invention relates to a method of forming a silicon diffusion and/or overlay coating on the surface of a metallic substrate comprising the steps of introducing the sample into a cold wall Low Pressure Chemical Vapor Deposition (LPCVD) enclosure, evacuating the enclosure up to a pressure $P_1$ which is lower than 0.5 Torr, maintaining said pressure $P_1$ while heating up said sample to a temperature which is comprised between about room temperature and about 300° C., bringing under same pressure P1 the sample to the CVD temperature comprised between about 50° C. and 1000° C., introducing a gas or gas mixture comprising at least one silicon hydride gas, maintaining the pressure inside the enclosure between about 0.1 and about 100 Torr, maintaining the introduction of said gas or gas mixture in the enclosure for deposition and/or diffusion of silicon on and/or through the surface of said metallic sample to obtain the desired thickness of the silicon diffusion and/or overlay coating, cooling down the sample to about room temperature and withdrawing said sample from said LPCVD enclosure. The substrate is preferably polished to obtain a mirror finish and then cleaned, either mechanically or chemically, with a solvent, or both.

13 Claims, 6 Drawing Sheets

METHOD OF FORMING A SILICON DIFFUSION AND/OR OVERLAY COATING ON THE SURFACE OF A METALLIC SUBSTRATE BY CHEMICAL VAPOR DEPOSITION

This application is a continuation-in-part (CIP) of application Ser. No. 07/686,487, filed on Apr. 17, 1991, now abandoned.

FIELD OF THE INVENTION

The invention relates to the formation of a silicon diffusion and/or overlay coating on the surface of metallic substrate by Chemical Vapor Deposition (CVD) and more particularly on iron and iron-base alloys.

DESCRIPTION OF THE PRIOR ART

Silicon surface diffusion on iron-based metals, i.e. iron and iron alloys and other metals as well, has been performed by Chemical vapor deposition from $SiH_4$ and $SiCl_4$ gases, under particular conditions disclosed hereunder. It is known from Japanese Patent Applications 62-227036, 62-227035 and 62-227033, all assigned to NKK to use silicon chloride $SiCl_4$ with an atmospheric pressure CVD process to make silicon surface diffusion on iron and iron-silicon steel. The process disclosed in those three patent applications is similar and is consisting of a first step wherein the sample surface is cleaned with polishing means or chemical means, a second step consisting of an atmospheric pressure $SiCl_4$ injection in the CVD enclosure under high temperature conditions between 1100° and 1250° C. and a third step consisting of a diffusion of the silicon deposited during step 2 inside the sample at a temperature between 1200° and 1300° C. under an atmosphere of inert or non-oxidizing gases.

This process has drawbacks due essentially to the high temperature requirements and to the sample weight loss by sublimation of the in-situ generated $FeCl_2$, which induces a certain porosity of the sample after treatment and to difficulties to handle the chlorine base corrosive gases at the exhaust of the CVD enclosure.

It is known also from the article of Galerie et Caillet entitled "Protection of Iron against corrosion by surface Siliconization" published in Materials Chemistry 5, vol.2, pages 147 to 164 (1980) to use $SiH_4$ gas at atmospheric pressure and at high temperature of 1100° C. for making silicon surface diffusion in a metallic sample.

Recently, U.S. Pat. No. 4,714,632 disclosed a method of forming a silicon diffusion coating on the surface of a metallic sample consisting of a first step wherein the sample is heated below 1200° C. under a hydrogen atmosphere and a second step consisting of a heat treatment at atmospheric pressure at a temperature of less than 1000° C. under a controlled atmosphere of a gas mixture consisting of silane, and hydrogen. Overlay coating was performed by further thermal treatment under an oxygen donor gas the balance being pure hydrogen.

A similar process is also disclosed by Cabrera et al in an article entitled "Formation of silicon diffusion coatings on ferrous alloys from their reaction with Silane", surface and Coating Technology, 39/40 (1989)—pages 43 to 51. However this process is limited to thin diffusion layers, i.e. having a silicon diffusion coating of less than 10 $\mu$ thick and cannot provide a low silicon concentration layer. Various $FeSi_x$ phases are systematically present in the treated iron-based samples.

Furthermore, the first step of the process (pretreatment) takes a long time (about 1 h) while a large amount of hydrogen gas (about 1.5l:min) is needed for both pretreatment and treatment steps. Diffusion coatings of $FeSi_x$ and overlayer coatings of $SiO_2$ can be obtained with said process.

More recently, a significant improvement to this technique has been proposed in EP-A-409 687—Jalby et al—assigned to L'AIR LIQUIDE, wherein a low pressure CVD process is used to make silicon diffusion coatings on steel samples. The temperature range is 800° to 1100° C. and the silane gas is introduced in a hot wall CVD enclosure. Significant improvement over the above prior art is achieved because the silicon layer is up to 100 micron thick, and includes about 30% by weight of silicon in the diffusion coating. However, this improved process is still time consuming (about two hours are necessary to achieve those results) and overlay coating layer has not been reached.

SUMMARY OF THE INVENTION

The present invention provides a method of forming a silicon diffusion coating and/or a silicon base overlay coating on the surface of a metallic substrate, preferably an iron-base alloy. This method is carried out at reduced pressure in a cold wall Low Pressure Chemical Vapor Deposition (LPCVD) enclosure and at a temperature which can be as low as 50° C. using pure silane or a gas mixture comprising silane and a gas selected from the group comprising Helium, Hydrogen, Argon or a mixture thereof. Depending on experimental conditions, i.e. CVD temperature (usually between 50° C. and 1000° C.), flow rates and pressure, a solid solution of silicon and metal is obtained with controllable Silicon content, diffusion thickness and concentration gradient over the diffusion layer, and a silicon base overlay coating can also be obtained as well.

Generally, the metallic substrate used may be a substrate of any of Fe, Fe-based alloys, Al, Mg, Cu, Ti, V, Cr, Mn, Co, Ni, Zr, Nb, Mo, W or rare earth metals.

The overlay coatings are always dominated by high concentrations of Si (>30 At. %) with concentration and thickness which might fluctuate considerably. The Si content of the overlay coatings generally increases with the layer thickness.

The grain size of the overlay coatings varies from very fine (>0.5 $\mu$) to about 20 Microns across, while the grains are generally, rounded, angular, elongated or platey with respect to the experimental conditions. Except at very high Si concentrations (>90 At. %), the grains of the overlay coatings are normally not attached to each other and the individual grain boundaries are distinct. However, the individual grains are indistinguishable when the Si content exceeds 90 At. %. XRD analysis reveals the presence of FeSi and $Fe_5Si_3$ phases in the overlay coatings. Weak peaks corresponding to $FeSi_2$ have been also identified occasionally. The presence of silicon phase, which is not detected by XRD, is inferred from the high Si concentration of overlay coatings.

In the diffusion layers, the Si content is always less than 30 At. %, and the average layer growth rate is higher than that of the overlay coatings.

The grains are usually large (>10 Microns), strongly attached to each other and occur in polygonal form (mainly hexagonal) in the case of diffusion coatings.

The XRD peaks of the diffusion coatings with 2-4 At. % Si indicate solid-solution. The diffusion layers containing 26-29 At. % Si are almost entirely comprised $Fe_3Si$ phase, some times with small amounts of $Fe_5Si_3$, which is a high temperature phase.

The cross section analysis by SEM indicates the lack of voids or cavities in the layer-substrate interface suggesting the absence of Kirkendall effect.

Since the Si-concentration and surface morphology of the overlay and diffusion coatings are different, such properties are adopted to classify the coatings. The following paragraphs describe the properties of the coatings at various experimental conditions.

Effect of the Temperature on the Coating

The temperature of the substrate affects strongly on coating characteristics. Both the Si concentration and growth rate of the coatings change with the temperature. The coatings are always overlay within 350°-650° C. as demonstrated by the high Si concentration (>30 At. %) and the morphological characteristics. When the temperature exceeds 650° C., diffusion layers with variable Si content (always<29 At. %). depending on the gas flow rate occur.

The surface morphology of the coatings show gradual variation from 350° to 650° C. and then change dramatically with increasing temperature. The grain size generally increases and the grain shape changes from rounded or angular to elongated or platey form with the increase of temperature from 350° C.-650° C. Here, most of the grains are not bonded together and seem to possess distinct margins at low temperatures, but individual grain margins gradually disappear and become replaced by common boundaries with increasing temperature. At or after 650° C., with the emergence of diffusion coatings, the grain size sharply increases and the shape changes to polygonal (mainly hexagonal).

Effect of the Gas Composition on the Coating

The variation of Si content of the coatings with the CVD temperature exhibits nearly similar trends at the comparable flow rates of both pure or He diluted $SiH_4$ ($He/SiH_4$), when the temperature is >450° C. and other experimental conditions are constant. The Si-content of the coatings corresponding to high flow rates of both pure $SiH_4$ and $He/SiH_4$ considerably fluctuate within the whole temperature range. But for low gas flow rates, the differences in Si-concentration become narrower with the occurrence of diffusion coatings at or above 650° C. The layer growth rate also displays a comparable trend. These results indicate that for a given flow rate, the composition of the CVD gas, either pure $SiH_4$ or $He/SiH_4$, exerts minor or negligible influence on Si content and growth of the diffusion coatings.

Effect of the Pressure on the Coating

The total pressure in the chamber and the partial pressure of $SiH_4$ exert considerable effect on both Si concentration and thickness of the layers. At 550° and 650° C., the Si content of the depositions generally increases and layer thickness decreases with enhanced total pressure in the chamber. These differences are greater at lower pressures (<76 Torr) and become less obvious with increasing pressure.

The grains at low pressures (<76 Torr) are normally angular and smaller (about 3 microns across), and turn to rounded form and larger (about 6 microns across) with increasing pressure. The increase of Si content with pressure shows that the formation of overlay coatings is favoured at high pressures. When the temperature is greater than 650° C. and at high pressure (>1 Torr) fine silicon particles, formed by gas phase nucleation, cover the substrate surface.

Effect of the Flow-rate on the Coating

The average Si concentration increases and the layer growth rate decreases with increasing CVD gas flow rate when the other experimental conditions are constant for both pure $SiH_4$ or $He/SiH_4$. There is a greater possibility for the coatings to be overlay at higher gas flow rates as indicated by the average Si content. At high temperatures (>650° C.), low flow rates (<0.5 sccm), diffusion coatings with about 27-29 At % Si are obtained whereas high flow rates (>5 sccm) make superimposed diffusion and overlay coatings. The overlay coatings, which contain about 99 At % Si, easily peels off leaving a surface with 2-5 At. % Si. However, lower gas flow rates (0.2 to 2 sccm) resulted into the maximum layer thickness at 650° C. and 750° C.

Effect of Deposition Time on the Coating

Unlike the Si concentration, the thickness of the coatings increases strongly with the deposition time. In particular, the growth of the coatings increases sharply between 10 to 15 minutes of deposition and seems to be stable after that.

The grains are relatively small and less crystallized (islands like masses occur irregularly among polygonal crystals) at lower deposition times (<10 minutes), while they grew bigger and the islands gradually disappear with increasing time of deposition.

The Mechanical Properties of the Coatings

The Average Roughness

The average roughness ($R_a$) of the overlay coatings, measured using a roughness tester with touch sensor, remains low between the CVD temperature 350° to 650° C. and then increases with the temperature. This trend is observed for high and low flow rates of both $SiH_4$ and $He/SiH_4$. The diffusion coatings are much less smooth than the overlay coatings and among the diffusion coatings, the ones with 25-29 At. % Si are rougher than those containing 2-5 At. % Si. When the source gas is pure $SiH_4$ contrary to $He/SiH_4$, the roughness of the diffusion coatings of 26-29 At. % Si becomes smaller with increasing temperature. The average roughness of the coatings also increases with the Si-content.

The Average Hardness

The average Vickers hardness of the diffusion coatings is higher than that of the substrate and increases nearly linearly with Si content. The hardness of the overlay coatings cannot be measured accurately.

As a summary, the invention relates to overlay (poorly adhered), diffusion (well adhered), and gradient superimposed diffusion and overlay coatings on a substrate such as iron substrate by LPCVD of pure or diluted $SiH_4$, such as dilution in Helium.

The coatings according to the invention are essentially overlay for CVD temperatures between about 350° and about 650° C. regardless of the other conditions. Diffusion coatings with Fe-silicide (mainly $Fe_3Si$) are formed when the CVD temperature exceeds 650° C.

and the gas flow rate is low (<5 sccm). At higher gas flow rates (>10 sccm) and temperatures (>650° C.), the developed diffusion coatings are solid-solution (2-5 At. % Si) covered by an overlay coating.

The nature (overlay or diffusion), thickness and composition of the coatings can be controlled by selection of experimental parameters such as substrate temperature, CVD gas composition and flow rate, chamber pressure and deposition time according to the indication given here above. In particular, substrate temperature and CVD gas flow rate determine composition of the diffusion coatings—wether solid-solution or intermetallic. The diffusion coatings are harder than iron and the hardness generally increases with Si content.

According to the invention, it is thus possible to modify various materials to improve their surface properties including resistance to corrosion, particule generation, and moisture absorption.

Regarding the conditions of operation of the invention, the best results have been obtained by mechanically polishing the surface of the substrate to get a mirror surface finish and then by cleaning chemically (mechanical cleaning might be sometimes appropriate, either alone or in combination with chemical cleaning) said surface with a solvent. After introduction in CVD enclosure, an outgassing step is provided at a temperature between about room temperature and about 300° C. Then the substrate is heated at the CVD temperature, which is usually between 50° C. and 1000° C. and then the hydride gas (e.g. silane) is introduced in the CVD enclosure.

The duration of the process is relatively short and can be as short as 20 minutes (or even less), according to the desired silicon thickness and concentration.

According to a first preferred embodiment, it is possible to make silicon diffused samples for electromagnetic applications such as magnetic plates used to make transformers or the like under a temperature which is higher than about 650° C. and usually comprised between 650° C. and 1000° C. and silicon concentration in the sample of approximately 6.5% by weight.

According to a second preferred embodiment of the invention, it is also possible to improve chemical or mechanical surface properties, e.g. corrosion, adsorption, wear and abrasion resistances, the CVD temperature range being between 50° C. and 650° C., preferably between about 300° C. to about 500° C.

BRIEF DESCRIPTION OF THE DRAWINGS

In FIGS. 5 and 6, elemental analysis uses electron microprobe. FIG. 7 represents the layer electron depth profile (Sputter speed is 18 A/min).

DETAILED DESCRIPTION OF THE PREFERRED EMBODIMENTS

The present invention is a method of forming a silicon diffusion coating and/or overlay coating on the surface of a metallic sample, preferably iron base sample, comprising the treatment of said sample in a cold wall, low pressure CVD enclosure under an atmosphere comprising silane or a silicon hydride alone or a mixture of silane or a silicon hydride with an inert gas such as Helium or Argon or reducing gas such as hydrogen capable of reacting with the remaining oxygen species in the enclosure to avoid oxidation of the surface of the sample. The temperature in the enclosure is maintained between about 50° C. and 1000° C. as disclosed above, while the pressure is maintained as low as between about 0.1 Torr and about 100 Torr.

Silicon hydride flow rate is varied according to the final desired diffusion thickness and silicon content at the surface. This flowrate is determined according to the size of the enclosure, and of sample itself in order to ensure the above pressure limits.

The reaction time in the enclosure depends on the gas flowrate, pressure temperature etc. . . . , and can be as short as about 20 mm for formation of a layer of more than 100 $\mu m$ thickness. It is usually preferred to make first a surface cleaning of the sample surface onto and through which silicon is deposited and diffused. This surface cleaning is preferably a mechanical polishing or a chemical etching or ultrasonic cleaning in an hydrous acetone or any other means, known per se. The best results have been obtained with a process comprising a mechanical polishing to obtain a mirror polished surface, followed by a chemical ultrasonic cleaning.

According to the various parameters of the process indicated above, silicon concentration on the surface, silicon profile in the sample and diffusion thickness are controllable up to 100% for the concentration and up to several mm for the diffusion thickness.

Among the advantages of the method according to the invention are the absence of substantial porosity in both diffusion layer and at the interface of the diffusion layer with the underlying material, using a single step process in the CVD enclosure.

According to the invention, it is also possible to obtain silicon base overlay coatings. This overlay coating can be further oxidized and/or submitted to a further step of oxidation or nitridation, to obtain surface properties which are known per se.

Further advantages of the process are decrease of time and of gas consumption compared to the processes of the prior art.

The invention comprises two preferred embodiments:

A first embodiment according to which the sample after treatment contains a low silicon concentration, i.e. about 6.5% by weight, uniformely over a thickness of alloyed layer up to several mn, particularly useful for electromagnetic application as known per se.

A second embodiment according to which the sample after treatment has a high silicon concentration (greater than 7%, preferably greater than 14.5% by weight) and wherein silicon is either diffused through the surface or coated on the surface of the iron base alloy, particularly useful when reinforcement of the chemical or mechanical properties of the metallic sample is requested (such as reinforcement against corrosion, adsorption or of wear, hardness, etc. . . . )

DETAILED DESCRIPTION OF PROCESS

The sample is first cleaned with an organic solvent and mechanically polished to mirror surface (preferably with a final stage of polishing being done with 0.3 micron Al$_2$O$_3$) or cleaned with an acidic solution.

Before starting silicon deposition and/or diffusion of silicon, i.e. starting silane injection in the CVD enclosure, it is necessary to introduce the sample in the enclosure, evacuate said enclosure and outgas said sample preferably by heating said sample at a temperature between room temperature and about 300° C.

After this outgassing step, the substrate is heated up to a CVD temperature under vacuum or inert gas residual pressure of about 0.5 Torr. The sample is then ready for surface treatment; silane gas alone or a mixture of silane gas and another gas selected from the group comprising Helium, Argon, Hydrogen or a mixture thereof is injected in the enclosure, while maintaining the pressure lower than 100 Torr to make simultaneous silicon deposition and diffusion.

When the surface treatment is completed, the sample is cooled down under an inert gas atmosphere. It has been discovered according to the invention that a key factor to achieve a successfull silicon deposition was the use of cold wall enclosure and of low pressure during the CVD and diffusion processes.

The invention will be better understood with the following examples along with the drawings.

EXAMPLE 1

This first example is directed to the production of a material having utility more particularly for electromagnetic applications i.e. obtaining a layer containing uniformely approximately 6.5 wt % silicon over a thickness of a few hundred $\mu$m at the surface of an iron or iron-silicon alloy substrate.

The substrate or sample is first mechanically polished with an abrasive powder of a very small diameter, comprising alumina and, diamond powders. After obtaining a mirror finish on the surface of the substrate where silicon has to be deposited, said substrate is further ultrasonically cleaned in anhydrous acetone.

After cleaning the sample as indicated above, the sample is introduced in the enclosure which is evacuated during 5 minutes at a pressure which is lower that 0.5 Torr (preferably 0.1 Torr), the temperature being room temperature, then the sample is heated at a temperature greater than 700° C. and preferably about 800° C., under a residual inert gas atmosphere at a pressure lower than 0.5 Torr in order to maintain the sample cleanness.

Figure 1:
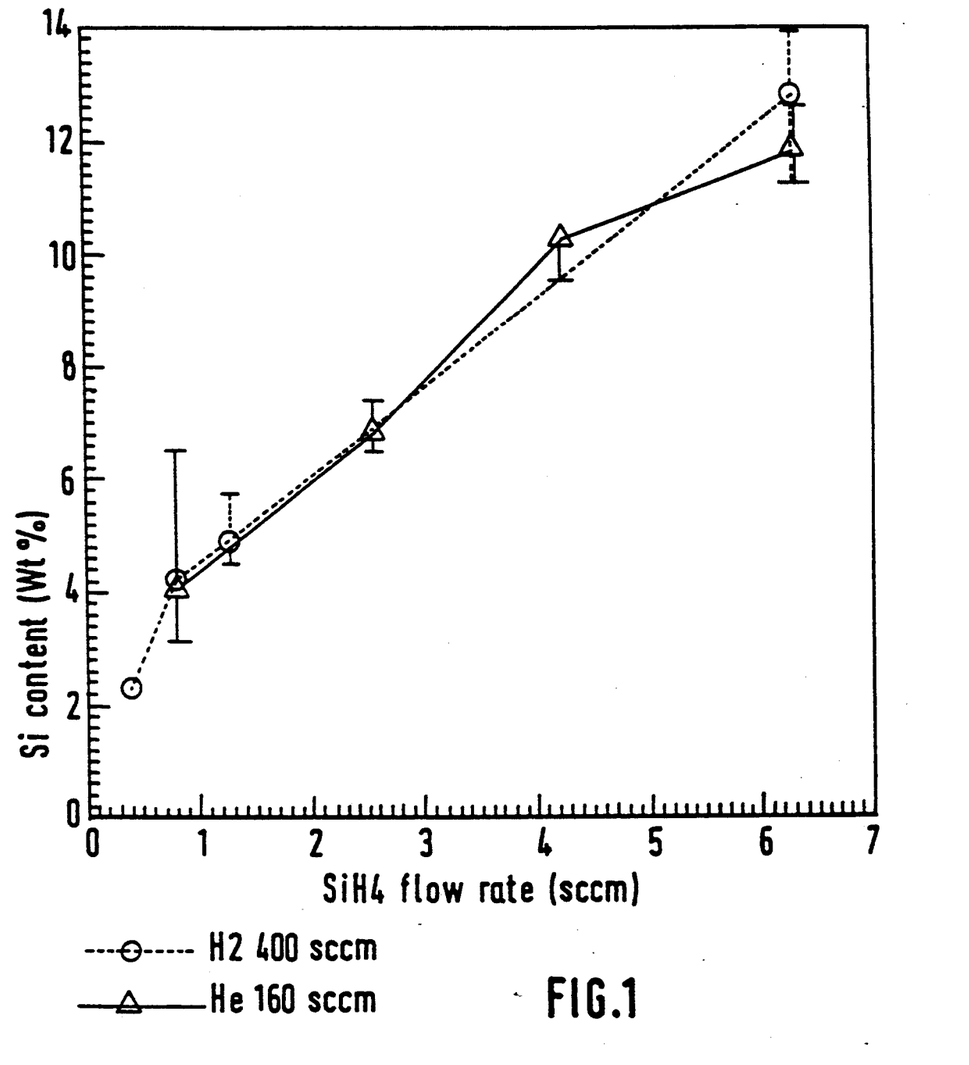
FIG. 1 is a plot of Si content at the surface of the sample (weight %) versus $SiH_4$ flowrate (sccm). CVD pressure and temperature are 0.5 Torr and 800° C. respectively. Circles and triangles correspond to dilution by 400 sccm H2 and 160 sccm He respectively.
Figure 2:
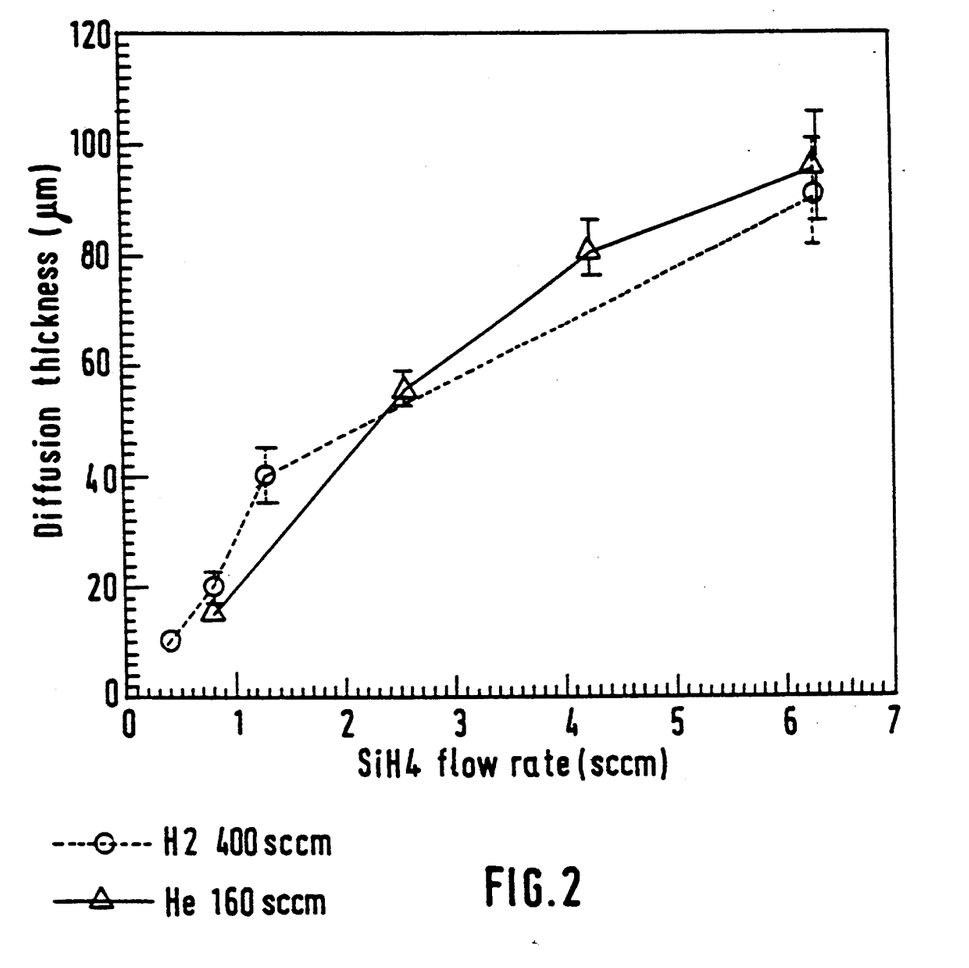
FIG. 2 is a plot of diffusion thickness in the sample (microns) vs $SiH_4$ flowrate (sccm). Other parameters are as in FIG. 1.
Figure 5:
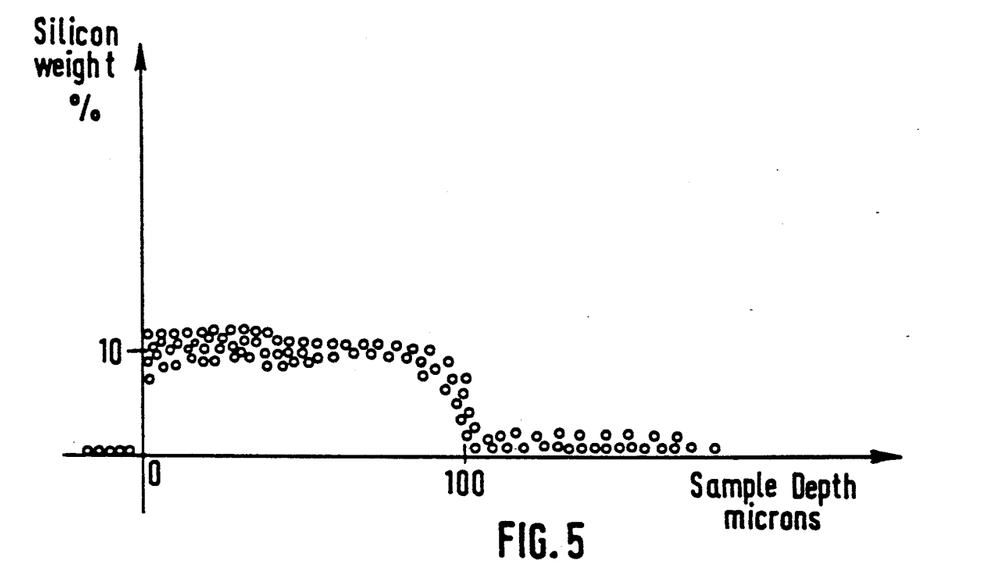
FIGS. 5, 6 and 7 show the silicon concentration profile at the surface of the sample and across the sample thickness for various CVD conditions.

The next step consists in maintaining the temperature within the above range higher than 700° C. and preferably by 800° C., while silane (or silicon hydrides) alone or with a diluting gas (He, Ar, H$_2$ or a mixture thereof) is injected in the enclosure with an enclosure pressure which is between about 0.5 Torr and 2.0 Torr. The silane flow rate is approximately 2 to 6 sccm pure or diluted by above gases. A uniform diffusion thickness of 50 to 100 $\mu$m is thus obtained in 20 mn (FIG. 2). The diffused layer thickness is linear with CVD treatment duration from a few minutes up to several hours and is uniform in silicon concentration (FIG. 5). The diffusion thickness and the Si concentration in the sample are controlled only by the net flow rate of SiH$_4$; it does not make substantial difference to dilute SiH$_4$ with Ar, He and/or H$_2$ or to use it alone (FIGS. 1,2).

Figure 3:
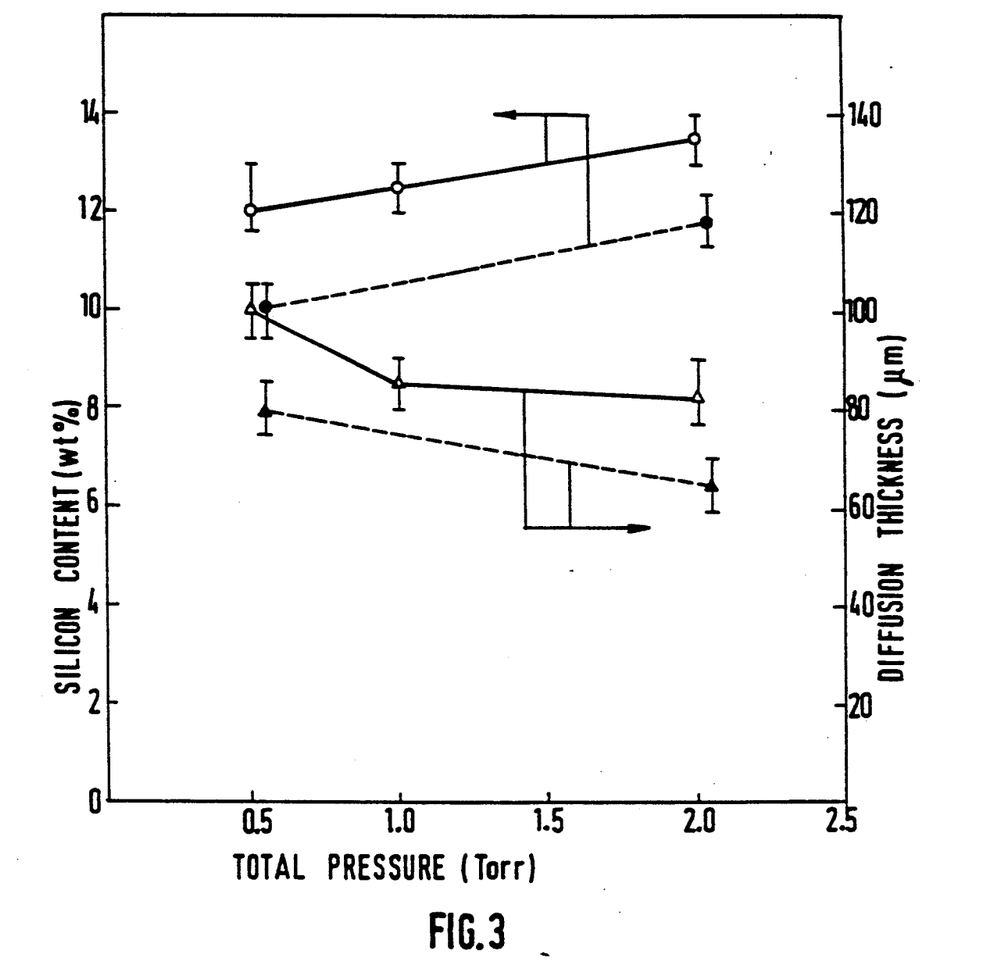
FIG. 3 is a plot of the surface concentration of silicon and diffusion thickness of silicon, vs pressure in the enclosure (Torr) for 2 different silane flowrates: 4.2 sccm (dotted line) and 6.3 sccm (continuous line).

Within above pressure range, the silicon concentration in the diffusion layer increases slightly with total pressure whereas the thickness of the diffusion layer is essentially constant (FIG. 3). Tests also have indicated that the pressure within the above defined range has no significant effect on the properties of the treated sample, except that the lower the pressure is, the smoother the surface of the sample is.

Results of the above examples are shown on FIGS. 1, 2, 3 and 5. The conditions of CVD experiment of FIG. 5 are the following: T=800° C., P=0,5 Torr, SiH$_4$ flowrate=6,3 sccm, He flowrate=157 sccm; Duration of experiment: 20 min.

EXAMPLE 2

This second example is particularly directed to the production of chemically functional surfaces, e.g. corrosion resistant and gas adsorption controlled surfaces on iron, iron base alloys and stainless steel substrates.

As known per se, this involves surfaces with high silicon concentration, i.e. above 7%, preferably above 14.5 wt %. This result is obtained with a temperature range of the CVD process comprised between 300° and 500° C.

Corrosion resistant and adsorption controlled properties are achieved by the silicon rich surface and the good adhesion of that layer to the substrate is insured by silicon concentration gradient between the substrate and the surface of the metallic sample.

Polishing, cleaning, outgassing and heating conditions of the sample before silane injection in the enclosure are similar to those given in example 1 (mirror polishing, ultrasonic cleaning in solvent and outgassing during 5 mn at a pressure lower than 0,5 T at a temperature between room temperature and 300° C., substrate temperature is about 800° C., pressure is below 0.5 T, with residual atmosphere being preferably inert gas such as He or Argon or a mixture thereof).

The conditions for the further step (CVD diffusion) are generally different from example 1:

substrate temperature is preferably between about 300° C. to 500° C., pressure between about 0.5 to 100 Torr, silane (or silicon hydrides) flow rate is about up to 15 sccm. The diluting gases are He, Ar, and H$_2$ or a mixture thereof at a flow rate allowing to adjust the desired pressure according to specific pumping speed, reactor volume, etc. The duration is between several minutes and several hours.

Figure 4:
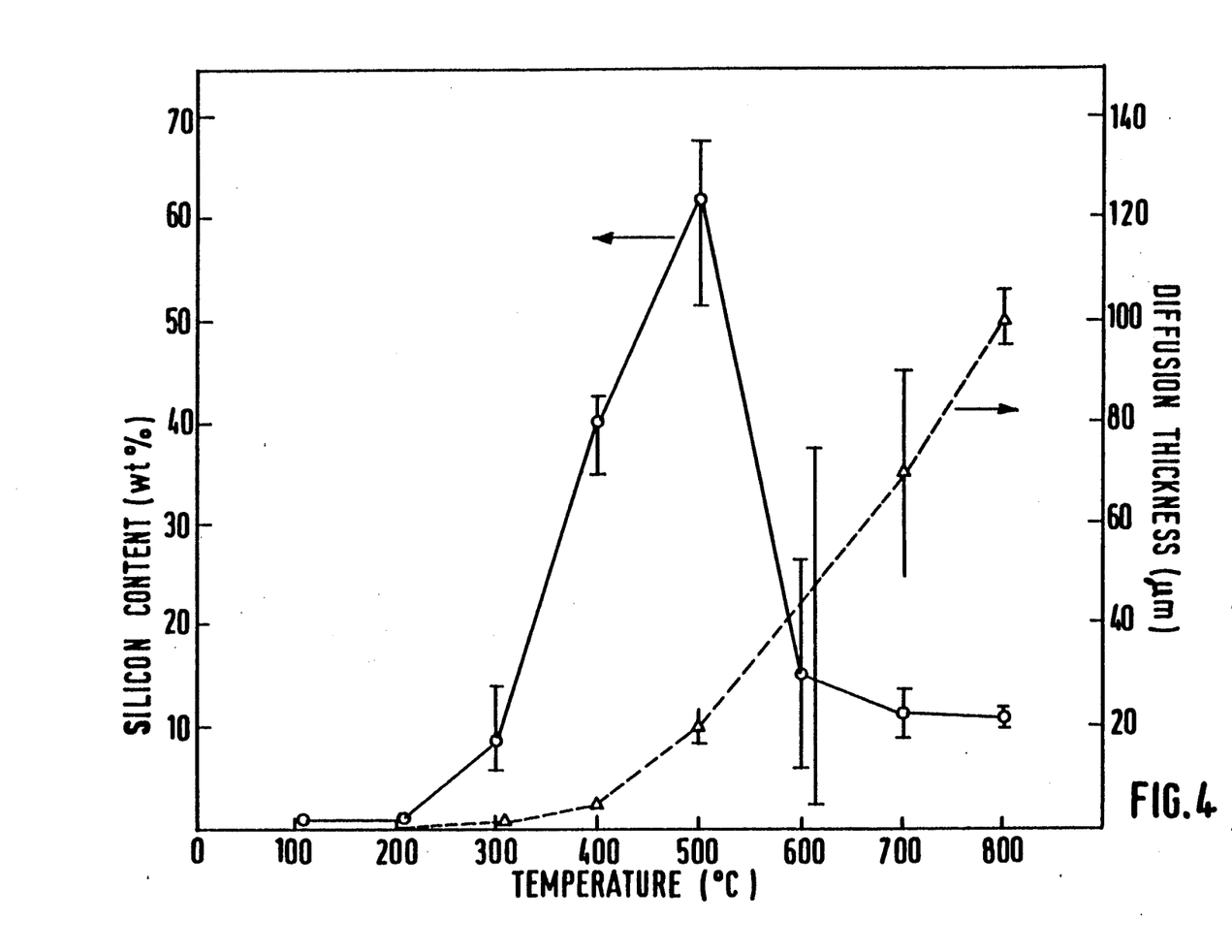
FIG. 4 is a plot showing the effect of temperature in the enclosure (°C.) on the surface concentration of silicon and diffusion thickness of silicon.
Figure 6:
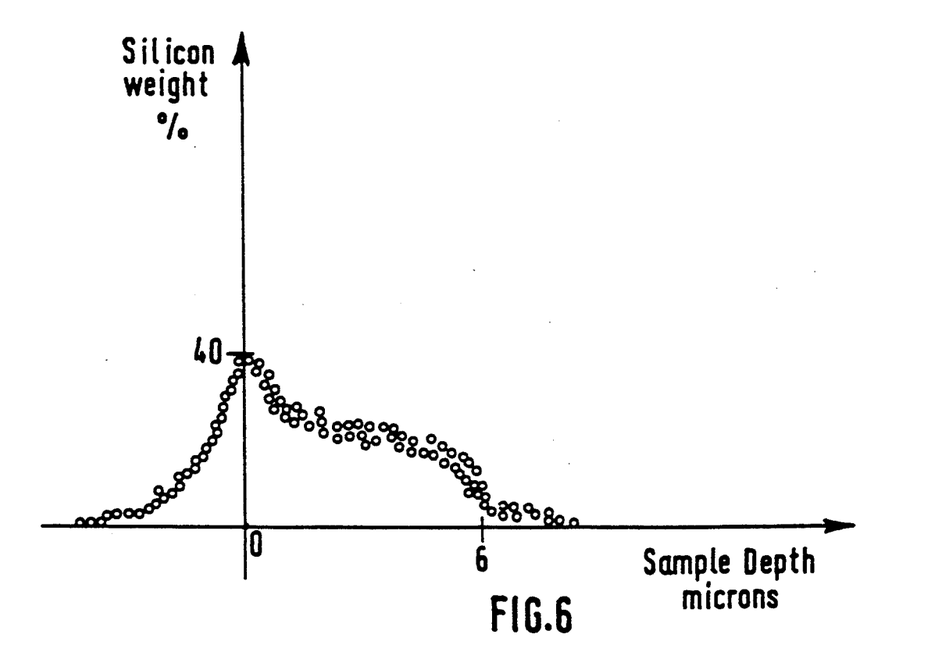

FIG. 4 illustrates the relationship of the silicon content and diffusion and/or deposition thickness with the substrate temperature. The silicon surface concentration and the thickness of the diffusion layer increase with temperature (FIG. 4) FIG. 6 illustrates one example of the depth dependance of the silicon concentration in the diffusion layer. It shows a high silicon concentration at the outer surface, which corresponds to Fe-silicon rich intermetallic phases. The surface is connected continuously to the substrate via a silicon concentration gradient, hence insuring for adhesion between the surface layer and the substrate.

The conditions of experiment of FIG. 6 were the following: T=400° C., P=0,5 Torr, Duration=20 min., SiH$_4$ flowrate=6,4 sccm, He flowrate=157 sccm.

EXAMPLE 3

The third example is particularly directed to the production of chemically functional surfaces, i.e. corrosion resistant materials, on iron, iron base alloys and stainless steels. This is achieved by formation of an overlay coating consisting of silicon, silicon oxide, silicon nitride or alloy of these compounds on top of above materials, with said overlay coating connected to substrate by a continuous silicon-concentration gradient across the interface. The preparation step of the sample in the CVD enclosure is as disclosed in example 1.

The CVD step for diffusion and overlay coating under silane atmosphere is performed at a CVD temperature between 50° C. and 300° C., preferably between 200° and 300° C. with a silane flow rate of up to 20 sccm and a total pressure between abot 0.5 and 100 Torr.

Figure 7:
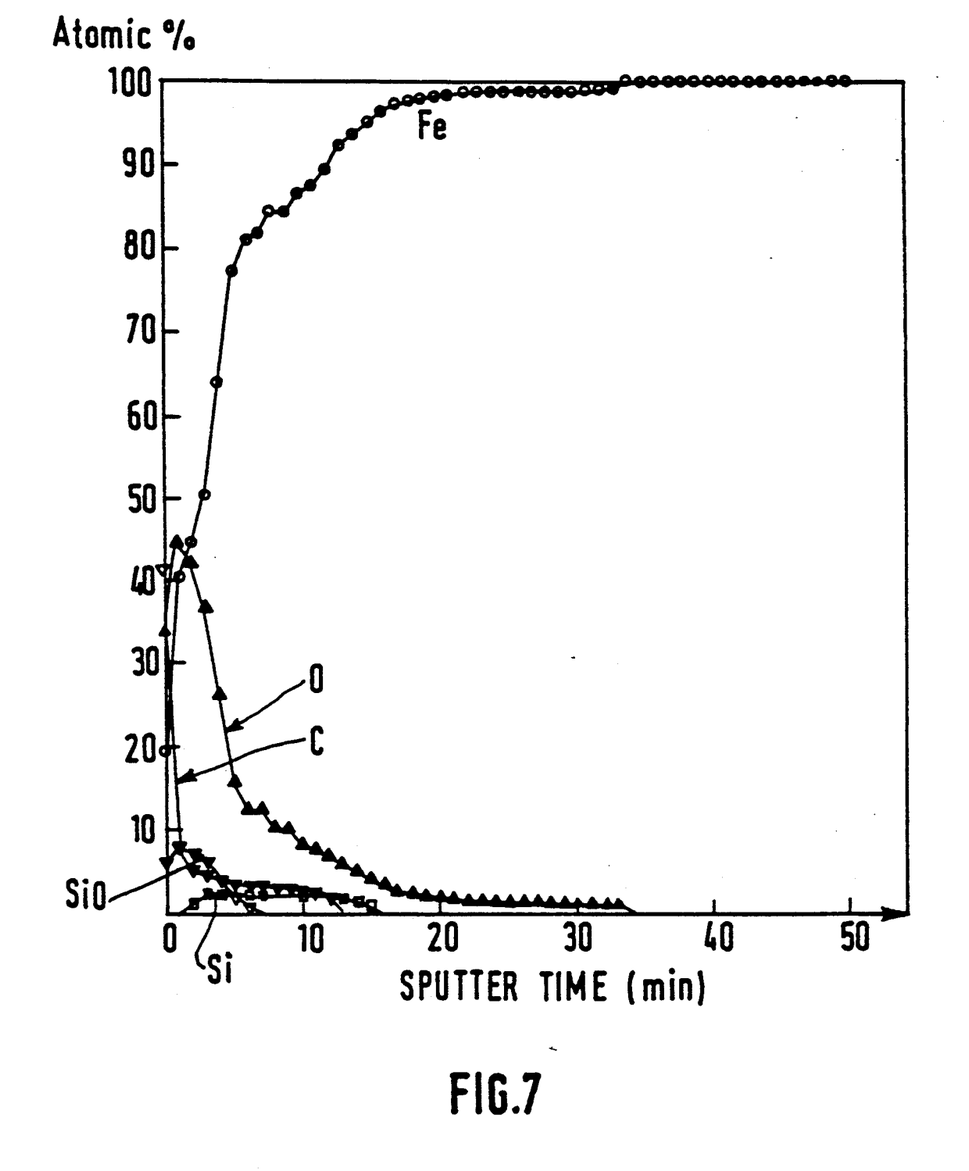

FIG. 7 shows the silicon concentration dependance across the sample thickness as obtained by Auger electron spectroscopy.

An overlayer being essentially a silicon compound only is coated on a thin Fe-Si diffusion layer on top of the iron substrate.

The conditions of CVD experiment were the following:

| | |
|---|---|
| Temperature | 100° C. |
| $SiH_4$ flow rate | 6,3 sccm |
| He flow rate | 159 sccm |
| Pressure | 0,5 Torr |
| Duration | 20 min. |
| Sputter speed | 18 A/minute (50 min = 900 A) |

EXAMPLE 4

This example concerns the manufacture of Stainless Steel Piping for ultra high purity gas distribution. This is achieved by minimizing the molecular adsorption phenomena on the metallic wall, particularly for polar molecules such as $H_2O$, and by strong corrosion resistance of surfaces for handling inert and corrosive gases respectively. The above goal is reached through formation of $FeSi_x$ intermetallic phase diffusion layers containing above 14.5 wt % Si on the inner surface of stainless steel pipes such as 316LSS electropolished pipe.

The preparation step of sample is as in example 1 by pumping on the heated tubing. The CVD step for diffusion coating is performed at a CVD temperature between 300° and 700° C., preferably 400° to 500° C., with a Silane flow rate of 1 to 20 sccm and a pressure between 0.5 and 100 Torr, preferably between 1 and 20 Torr.

The hence produced tubings reveal significantly improved adsorption properties of polar impurities present in carrier gases, particularly $H_2O$. For instance, the total quantity of $H_2O$ adsorbed on a given piping area is decreased by more than one order of magnitude in comparison to electropolished piping. This is particularly useful for construction of ultrahigh purity gas distribution systems and the process is applicable to piping, cylinder, valves and other distribution component internal surfaces.

Moreover the corrosion deterioration of such components in presence of corrosive gases such as acids, etching gaes etc is significantly improved.

EXAMPLE 5

The same example as example 1 has been carried out, except that the pressure outgassing the substrate during 5 mn has been set at 1 Torr.

The diffusion coating obtained is less uniform with some spots of different thickness. This coating is not satisfactory.

This example clearly shows the criticality of the pressure of the CVD during the outgassing step.

EXAMPLE 6

Same example as example 1, except that no mechanical polishing of the substrate has been carried out.

The coatings are not good due to the presence of both diffusion coated and overlay coated spots.

EXAMPLE 7

Same as example 1, except that the pressure during outgassing step is 1 Torr and that no mechanical polishing of the substrate has been carried out.

The results are similar to those of example 6.

These examples 5, 6 and 7 clearly show the criticality of the parameters of the process.

What is claimed is:

1. A method of forming a silicon diffusion coating or silicon base overlay coating or both on the surface of a metallic sample, comprising:
   a) mechanically polishing a surface of the sample to form a mirror surface,
   b) cleaning said sample surface, and introducing the sample into a cold-wall low pressure chemical vapor deposition (LPCVD) enclosure,
   c) evacuating the enclosure up to a pressure, $P_1$, which is lower than about 0.5 Torr, and at a temperature between room temperature and about 300° C.,
   d) maintaining said pressure, $P_1$, while heating the sample to a temperature of at least about 50° C.,
   e) introducing a gas or gas mixture comprising at least one silicon hydride gas, and maintaining the pressure inside the enclosure between about 0.1 and about 100 Torr,
   f) maintaining the introduction of the gas or gas mixture in the enclosure for deposition or diffusion of silicon or both, on or through the surface of the metallic sample or both, to obtain a thickness of the silicon diffusion or silicon overlay coating, and
   g) cooling the sample to about room temperature, and withdrawing the sample from the LPCVD enclosure.

2. The method of claim 1, wherein said metallic sample is made of a material selected from the group consisting of Fe, Fe-based alloys, Al, Mg, Cu, Ti, V, Cr, Mn, Co, Ni, Zr, Nb, Mo, Ta, W and rare earth metals.

3. The method of claim 1, wherein in step d), said sample is heated to a temperature of between about 50° C. and 1,000° C.

4. The method of claim 3, for producing a coated iron-based sample, wherein said sample is heated in step d) to a temperature of greater than about 650° C., and said gas or gas mixture is introduced in step e) so as to obtain the silicon diffusion coating having silicon in the coating of about 6.5% by weight, and which is substantially uniform over the diffusion thickness.

5. The method of claim 3, wherein the sample is heated in step d) to between about 650° C. and 1000° C.

6. The method of claim 1, for producing a silicon diffusion coating having anticorrosion or gas adsorption properties or both, wherein said temperature at which said sample is heated is between about 50° C. and 650° C., and said gas mixture introduction is controlled to obtain the silicon diffusion coating wherein the concentration of silicon in the coating is greater than 7% by weight.

7. The method of claim 6, wherein said sample is heated between about 300° C. and about 500° C.

8. The method of claim 6, wherein the concentration of silicon in the coating is equal to about 14.5% by weight.

9. The method of claim 1, wherein said silicon overlay coating has a silicon content of greater than 30 At. %.

10. The method of claim 1, wherein said silicon diffusion coating has a silicon content of less than 30 At. %.

11. The method of claim 1, wherein said sample is cleaned in step b) by acidic cleaning or ultrasonic solvent cleaning or both.

12. The method of claim 1, wherein in step e), said gas is silane gas, and said gas mixture is silane gas and another gas selected from the group consisting of He, Ar, $H_2$ and a mixture thereof.

13. The method of claim 1, wherein said sample is a stainless steel piping suitable for use in gas distribution.

* * * * *